United States Patent
Singh et al.

(10) Patent No.: US 10,347,528 B1
(45) Date of Patent: Jul. 9, 2019

(54) INTERCONNECT FORMATION PROCESS USING WIRE TRENCH ETCH PRIOR TO VIA ETCH, AND RELATED INTERCONNECT

(71) Applicant: GLOBALFOUNDRIES INC., Grand Cayman (KY)

(72) Inventors: Sunil K. Singh, Mechanicville, NY (US); Ravi P. Srivastava, Clifton Park, NY (US); Sipeng Gu, Clifton Park, NY (US); Akshey Sehgal, Malta, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/912,975

(22) Filed: Mar. 6, 2018

(51) Int. Cl.
*H01L 21/4763* (2006.01)
*H01L 21/768* (2006.01)
*H01L 23/522* (2006.01)
*H01L 23/532* (2006.01)

(52) U.S. Cl.
CPC .. *H01L 21/76843* (2013.01); *H01L 21/76808* (2013.01); *H01L 21/76811* (2013.01); *H01L 21/76813* (2013.01); *H01L 21/76814* (2013.01); *H01L 21/76835* (2013.01); *H01L 23/5226* (2013.01); *H01L 23/53266* (2013.01); *H01L 2221/1036* (2013.01)

(58) Field of Classification Search
CPC ......... H01L 21/76843; H01L 21/76808; H01L 21/76811; H01L 21/76813; H01L 21/76814; H01L 21/76835; H01L 23/5226; H01L 23/53266

USPC ........................................................ 438/629
See application file for complete search history.

(56) References Cited

U.S. PATENT DOCUMENTS

| | | | |
|---|---|---|---|
| 6,566,242 B1 * | 5/2003 | Adams | H01L 21/31053 257/E21.244 |
| 7,585,768 B2 * | 9/2009 | Bu | H01L 21/288 257/E21.575 |
| 7,884,013 B2 | 2/2011 | Tseng et al. | |
| 8,114,769 B1 * | 2/2012 | Srivastava | H01L 21/31144 257/E21.579 |
| 9,576,894 B2 * | 2/2017 | Singh | H01L 21/31144 |
| 9,728,503 B2 | 8/2017 | Peng et al. | |
| 9,799,559 B1 | 10/2017 | Siddiqui et al. | |

* cited by examiner

*Primary Examiner* — Luan C Thai
(74) *Attorney, Agent, or Firm* — Anthony Canale; Hoffman Warnick LLC (57) ABSTRACT

Methods of forming an interconnect of an IC are disclosed. The methods etch a wire trench opening partially into an ILD layer using a hard mask, and form a metal liner sidewall spacer on sidewalls of the wire trench opening, prior to etching via openings that create a via-wire opening with the wire trench opening. The metal liner sidewall spacer protects against chamfering during the via etch and/or removal of an etch stop layer over conductive structures in an underlying ILD layer. In one embodiment, a barrier liner is deposited over the metal liner sidewall spacer, creating a double layered sidewall spacer on the sidewalls of the wire trench opening portion of the via-wire opening. A conductor is deposited to form a unitary via-wire conductive structure. An interconnect includes the double layered sidewall spacer on the sidewalls of a wire trench opening portion of the via-wire conductive structure.

12 Claims, 7 Drawing Sheets

INTERCONNECT FORMATION PROCESS USING WIRE TRENCH ETCH PRIOR TO VIA ETCH, AND RELATED INTERCONNECT

BACKGROUND

The present disclosure relates to integrate circuit (IC) interconnects, and more specifically, to methods of forming an interconnect with a via-wire conductive structure using a wire trench etching first process and a double layered sidewall spacer. A related interconnect, and a related method using the wire trench etching first process, are also disclosed.

Integrated circuits include a number of interconnect layers that allow for electrical interconnection of devices in various layers such as transistors, resistors, capacitors, etc. Each interconnect layer typically includes wiring that laterally interconnects structures, or vias that vertically interconnect structures. Each interconnect layer typically includes a dielectric layer into which the wires and/or vias, which are collectively and individually referred to herein as interconnects, are formed. Each interconnect layer is typically separated by an etch stop layer that is used to control etching during formation of the interconnect layers.

Damascene is a process in which an interconnect pattern is first lithographically defined in a layer of dielectric, then metal is deposited to fill resulting wire trench openings or via openings, and then excess metal is removed by means of chemical-mechanical polishing (planarization). Dual damascene is a similar process in which interconnect patterns define wire trench openings and via openings together prior to metal deposition.

Figure 1:
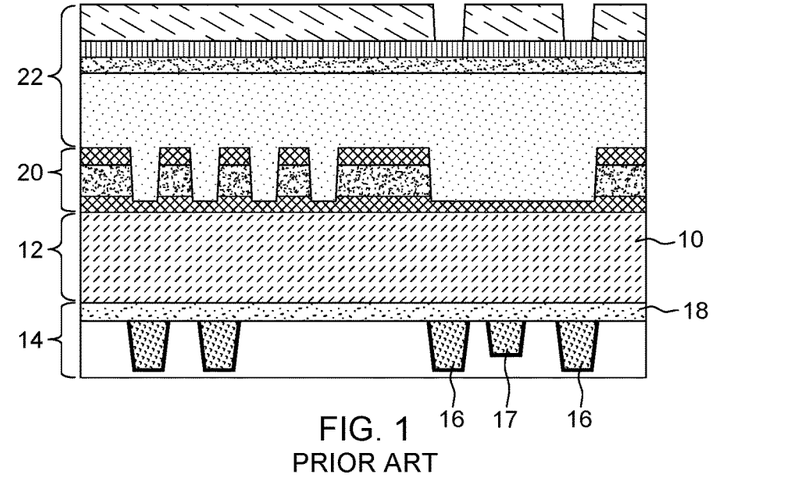
FIGS. 1-3 show cross-sectional views of a conventional process of forming an interconnect including a via-wire conductive structure.
Figure 2:
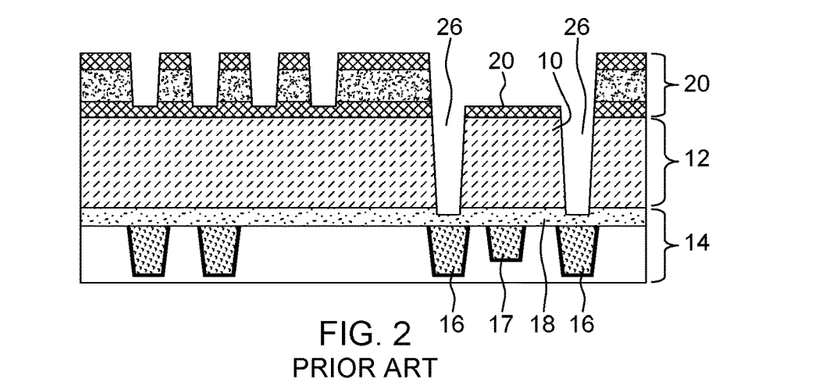
Figure 3:
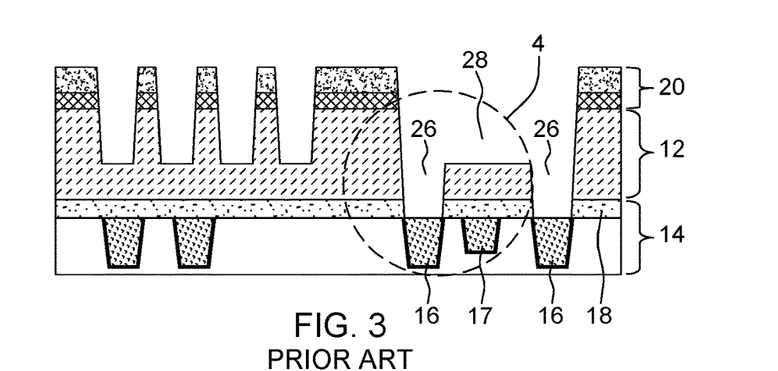

FIGS. 1-3 show cross-sectional views of a conventional dual damascene process for forming a via-wire conductive structure in a dielectric layer 10 of an interconnect layer 12. Interconnect layer 12 is positioned over a lower interconnect layer 14 including, as shown in FIG. 1, a number of vias 16 and a wire 17 (16 and 17 are underlayer metal lines). Interconnect layers 12, 14 are separated by etch stop layer 18, e.g., nitrogen-doped carbide (NDC) or nitrogen-doped silicon carbide (SiCxNyHz)(NBLOK). In this example, a dual damascene process for creating via-wire structure in interconnect layer 10 includes forming a hard mask 20 over dielectric layer 10 including a wire trench pattern therein, then forming a via mask 22 having a via opening pattern therein over hard mask 20. As shown in FIG. 2, an etching is then carried out to etch via openings 26 for vias into dielectric layer 10. At this stage, via openings 26 expose etch stop layer 18. As shown in FIG. 3, the via etching is followed by a wire trench etching to etch wire trench opening 28 for a wire (wire will couple vias formed in via openings 26). Each etching may include, for example, a reactive ion etch (RIE).

Figure 4:
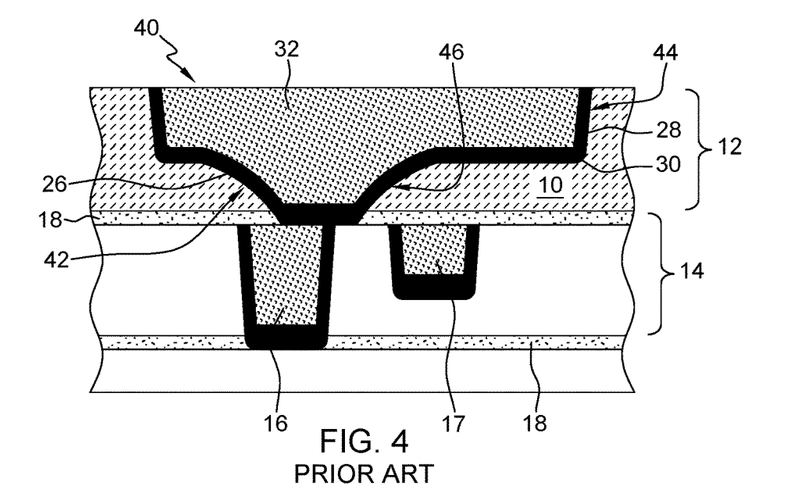
FIG. 4 shows an enlarged cross-sectional view of the via-wire conductive structure formed by the processes of FIGS. 1-3.

FIG. 4 shows an enlarged cross-sectional view of a portion of FIG. 3 after metal has been deposited in openings 26, 28. More particularly, after etch stop layer 18 is removed, conventional processing continues with a barrier liner 30 (e.g., refractory metal) deposition into via opening 26 and wire opening 28, then a metal 32 (e.g., copper) deposition and a planarization to create a via-wire conductive structure 40 including a via 42 and a wire 44. Via 44 preferably lands on via 16 or another conductive structure, e.g., a wire or device, in lower interconnect layer 14.

Figure 5:
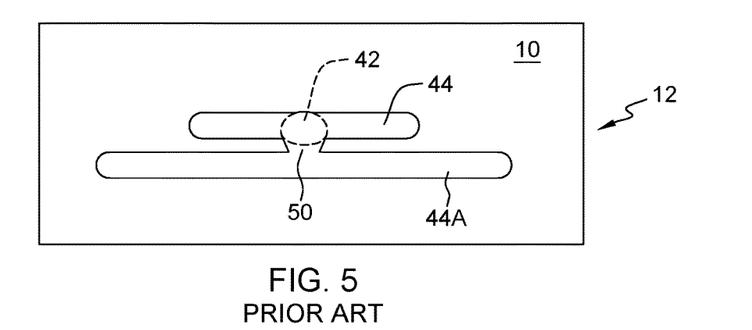
FIG. 5 shows a plan view of the via-wire conductive structure formed by the processes of FIGS. 1-3.

A challenge with this process is that the trench etching (FIG. 2) to create wire trench opening 28 for wire 44 can impact aspects of via opening 26 for via 42, and hence the operation of via 42. First, as shown in FIG. 4, an enlarged chamfer 46 can be created during trench etching (FIG. 3) that can cause a short of via 42 to, for example, wire 17 therebelow (or another via in the same location as wire 17). The ability for enlarged chamfer 46 to create a short can be increased, for example: by an overlay error (OVL) in the mask patterning for via 42, via 16, wire 44 and/or wire 17; a non-uniformity or an angle variation of via 42 and/or via 16; and/or a high voltage strip fail; among other things. Second, as shown in a plan view in FIG. 5, the trench etching coming after via etching can create a via bumpout 50 that when filled with metal can short via 42 (shown in phantom under wire 44) to, for example, another wire 44A above via 42. In particular, the trench etching can erode metal liner 30 (FIG. 4) that can allow for the short. Even if a short does not immediately result, the occurrence of shorts can still be increased because of the increased chances of time dependent dielectric breakdown (TDDB) caused by the overlay error or liner erosion. These challenges may be more profound near a wafer edge due to increased etch stop layer erosion during dielectric reactive ion etching (RIE) at the edge, but they can be observed in any interconnect layer.

SUMMARY

A first aspect of the disclosure is directed to a method of forming an interconnect of an integrated circuit (IC), the method comprising: forming a hard mask including a wire trench mask pattern therein over a precursor structure, the precursor structure including a first interlayer dielectric (ILD) layer over an interconnect layer, the interconnect layer including a number of conductive structures in a second ILD layer under an etch stop layer; first etching a first wire trench opening partially into the first ILD layer using the hard mask; forming a first metal liner sidewall spacer on sidewalls of the first wire trench opening; after the first etching, forming a via mask over the first wire trench opening, the via mask including a via opening mask pattern therein; second etching a via opening through a remaining portion of the first ILD layer to the etch stop layer using the via mask, creating a via-wire opening with the first wire trench opening in the first ILD layer; removing the etch stop layer over the conductive structures in the second ILD layer to expose an upper surface of the conductive structures, the removing leaving the first metal liner sidewall spacer; depositing a barrier liner over the via-wire opening, the first metal liner sidewall spacer and the exposed upper surface of the conductive structures, creating a first double layered sidewall spacer with the first metal liner sidewall spacer on the sidewalls of the first wire trench opening portion of the via-wire opening; and forming a unitary via-wire conductive structure in the via-wire opening by depositing a conductor in the via-wire opening.

A second aspect of the disclosure includes an interconnect for an integrated circuit (IC), the interconnect comprising: a unitary via-wire conductive structure in an interlayer dielectric (ILD) layer, the unitary via-wire conductive structure including a via portion and a wire trench portion above the via portion; and a double layered sidewall spacer between the wire trench portion of the via-wire conductive structure and the ILD layer.

A third aspect of the disclosure related to a method of forming an interconnect of an integrated circuit (IC), the method comprising: forming a hard mask including a wire trench mask pattern therein over a precursor structure, the precursor structure including a first interlayer dielectric (ILD) layer over an interconnect layer, the interconnect layer including a number of conductive structures in a second ILD layer under an etch stop layer; first etching a first wire trench opening partially into the first ILD layer using the hard mask; forming a titanium nitride layer in the first wire trench opening; after the first etching, forming a via mask over the first wire trench opening in the first ILD layer, the via mask including a via opening mask pattern therein; second etching a via opening through the titanium nitride layer and a remaining portion of the first ILD layer to the etch stop layer using the via mask, creating a via-wire opening with the first wire trench opening, the titanium nitride layer remaining on a sidewall of the first wire trench opening; removing the titanium nitride layer remaining in the sidewall of the first wire trench opening and the etch stop layer over the conductive structures in the via opening in the second ILD layer to expose an upper surface of the conductive structures; depositing a barrier liner over the via-wire opening, and the exposed upper surface of the conductive structures; and forming a unitary via-wire conductive structure in the via-wire opening by depositing a conductor in the via-wire opening.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Embodiments of the disclosure provide methods of forming an interconnect of an IC. The methods etch a wire trench opening partially into an ILD layer using a hard mask, and form a metal liner sidewall spacer on sidewalls of the wire trench opening, prior to etching via openings that create a via-wire opening with the wire trench opening. The metal liner sidewall spacer protects against chamfering during the via etch and/or during removal of an etch stop layer over conductive structures in an underlying ILD layer. In one embodiment, a barrier liner is deposited over the metal liner sidewall spacer, creating a double layered sidewall spacer on the sidewalls of the wire trench opening portion of the via-wire opening. A conductor is deposited to form a unitary via-wire conductive structure. An interconnect according to embodiments of the disclosure includes the double layered sidewall spacer on the sidewalls of a wire trench portion of the via-wire conductive structure. The methods enable, among other things, a chamferless via formation and dual damascene profile control.

Referring to FIGS. 6-15, cross-sectional views of a method of forming an interconnect 100 (FIG. 15) of an integrated circuit (IC) according to one embodiment of the disclosure will now be described. As will be described, interconnect 100 (FIG. 15) is formed in an interconnect layer 102 (FIG. 15) above another interconnect layer 114. Interconnect layers 102, 114 may be in any back end of line (BEOL) layer of an IC. As understood in the art, BEOL indicates any IC fabrication processes performed on the semiconductor wafer in the course of device manufacturing following first metallization.

Figure 6:
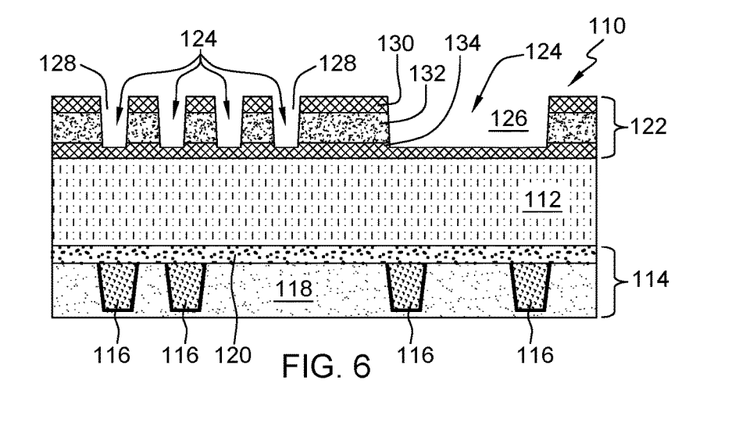
FIGS. 6-15 show cross-sectional views of a method of forming an interconnect according to embodiments of the disclosure, with FIG. 15 showing an embodiment of the interconnect.

FIG. 6 shows a precursor structure 110 including a first interlayer dielectric (ILD) layer 112 (to be part of interconnect layer 102 (FIG. 15)) over a lower interconnect layer 114. Interconnect layer 114 may include a number of conductive structures 116 in a second ILD layer 118 under an etch stop layer 120. Each ILD layer 112, 118 may include but are not limited to: carbon-doped silicon dioxide materials; fluorinated silicate glass (FSG); organic polymeric thermoset materials; silicon oxycarbide; SiCOH dielectrics; fluorine doped silicon oxide; spin-on glasses; silsesquioxanes, including hydrogen silsesquioxane (HSQ), methyl silsesquioxane (MSQ) and mixtures or copolymers of HSQ and MSQ; benzocyclobutene (BCB)-based polymer dielectrics, and any silicon-containing low-k dielectric. Examples of spin-on low-k films with SiCOH-type composition using silsesquioxane chemistry include HOSP™ (available from Honeywell), JSR 5109 and 5108 (available from Japan Synthetic Rubber), Zirkon™ (available from Shipley Microelectronics, a division of Rohm and Haas), and porous low-k (ELk) materials (available from Applied Materials). Examples of carbon-doped silicon dioxide materials, or organosilanes, include Black Diamond™ (available from Applied Materials) and Coral™ (available from Lam Research). An example of an HSQ material is FOx™ (available from Dow Corning). Although shown only for interconnect layer 114, it is understood that each interconnect layer may include an etch stop layer 120 thereover, which is used to stop certain etching processes occurring thereover, as will be described herein. Etch stop layers may include any now known or later developed etch stopping material such as but not limited to: titanium nitride (TiN), nitrogen-doped carbide (NDC) or nitrogen-doped silicon carbide (SiCxNyHz)(NBLOK). Conductive structures 116 in interconnect layer 114 may include wires, vias and/or via-wires (shown as vias), each with a conductor within a barrier liner. However, conductive structures 116 may include any now known or later developed BEOL structure: other interconnects, and/or passive devices such as resistors or capacitors, etc. Precursor structure 110 may be formed using any now known or later developed BEOL processing, including those of the present disclosure.

FIG. 6 also shows forming a hard mask 122 including a wire trench mask pattern 124 therein over precursor structure 110. In the example shown, wire trench mask pattern 124 includes a first wire trench mask opening 126 for use in forming one or more dual damascene via-wire openings according to embodiments of the disclosure, and may optionally include one or more second wire trench mask openings 128 for conventional wires. It is noted that the sizes of openings 126, 128 may vary, and no accuracy should be attributed to the relative sizes shown. Hard mask 122 may include any now known or later developed hard mask stack, and may be configured as a multi-color hard mask, i.e., capable of creating openings in a variety of different locations and orientations. In the example shown, hard mask 122 may include: a first silicon oxide ($SiO_2$) or silicon oxy-nitride (SiON) layer 130 over a silicon nitride ($Si_3N_4$) or titanium nitride (TiN) layer 132 over a second silicon oxide layer ($SiO_2$) or silicon oxy-nitride (SiON) 134. It is understood that hard mask 122 may take a wide variety of alternative forms. In FIG. 6, wire trench mask pattern 124 is shown at a stage at which wire trench mask pattern 124 extends through first silicon oxide or silicon oxy-nitride layer 130 and silicon nitride or titanium nitride layer 132 to or into an upper surface of second silicon oxide or silicon oxy-nitride layer 134.

Figure 7:
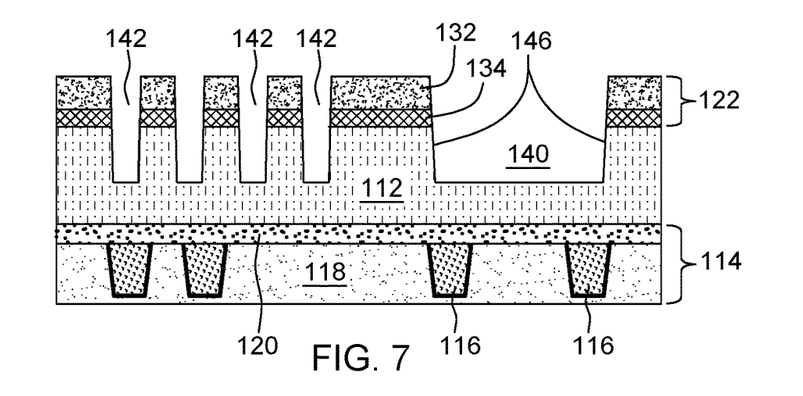

FIG. 7 shows etching a first wire trench opening 140 partially into first ILD layer 112 using hard mask 122. In accordance with embodiments of the disclosure, first wire trench opening 140 etching, in contrast to conventional dual damascene processes, occurs prior to via opening etching (see FIG. 2). Etching generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches. In the instant case, the etching may include any conventional etching process appropriate for ILD 112 such as but not limited to a RIE. The etching may remove part of hard mask 122, e.g., layer 130.

FIG. 7 also shows first etching including etching a second wire trench opening(s) 142 (four shown) partially into first ILD layer 112 using hard mask 122, i.e., using second wire trench mask opening(s) 128 (FIG. 6).

Figure 8:
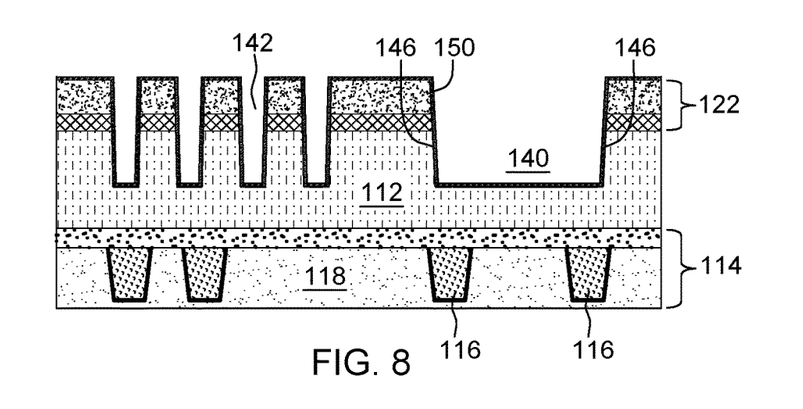
Figure 9:
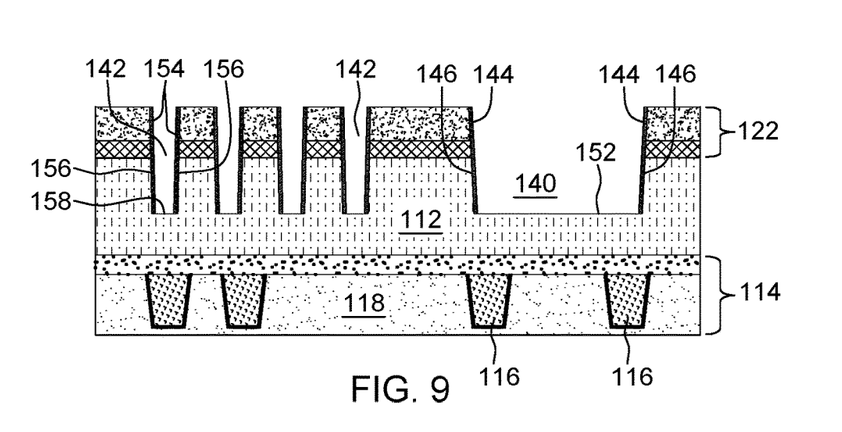

FIGS. 8-9 shows forming a first metal liner sidewall spacer 144 on sidewalls 146 of first wire trench opening 140. This process may include, as shown in FIG. 8, depositing a metal liner 150 in first wire trench opening 140. Metal liner 150 may include but is not limited to: ruthenium (Ru), cobalt (Co), tungsten (W), or combinations thereof. "Depositing" may include any now known or later developed techniques appropriate for the material to be deposited including but not limited to: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation. Here, metal liner 150 may be deposited using, for example, ALD. FIG. 9 shows etching first metal liner 150 from a bottom surface 152 of first wire trench opening 140. This etching may include any appropriate isotropic etching for metal liner 150 material, e.g., an isotropic RIE. As also shown in FIGS. 8-9, where second wire trench openings 142 are provided, this process may also form a second metal liner sidewall spacer 154 on sidewalls 156 of second wire trench opening(s) 142. FIG. 9 also shows etching first metal liner 150 from a bottom surface 158 of second wire trench opening 142, creating second metal liner sidewall spacer 154 from first metal liner 150.

Figure 10:
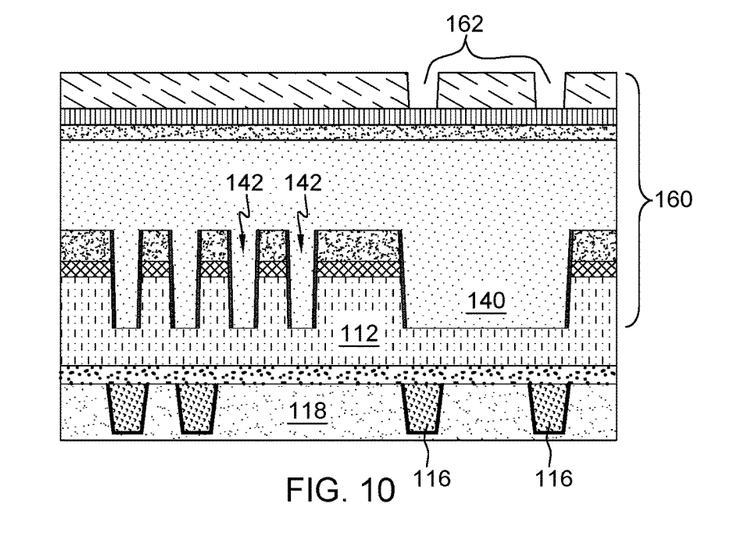

FIG. 10 shows forming a via mask 160 over (and in) first wire trench opening 140. Via mask 160 includes a via opening mask pattern 162 therein that defines where via openings 170 (FIG. 11) will be formed in ILD 112. To emphasize, this process occurs after first etching of wire trench opening 140 (FIG. 7). Via mask 160 may include any now known or later developed via mask, e.g., formed by way of lithographic stack deposition, exposure and development. Via opening mask pattern 162 is positioned over wire trench opening 140, but not over second wire trench opening(s) 142.

Figure 11:
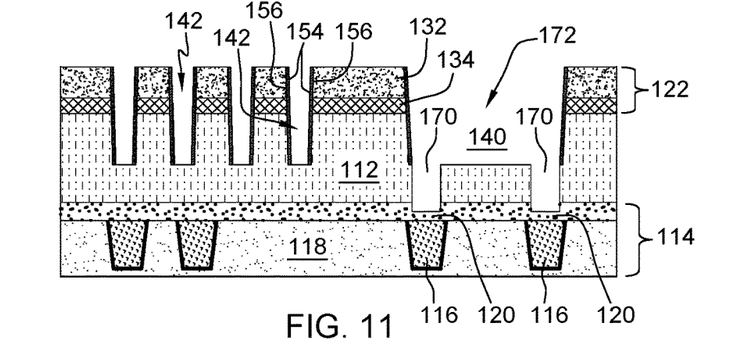

FIG. 11 shows etching a via opening(s) 170 through a remaining portion of first ILD layer 112 to etch stop layer 120 of interconnect layer 114 using via mask 160. Some of etch stop layer 120 may be etched away in this process. As shown, this etching creates a via-wire opening 172 with first wire trench opening 140 in first ILD layer 112. This etching may include any appropriate etching process for first ILD layer 112. In contrast to conventional processes, first metal liner sidewall spacer 144 maintains a definition of first wire trench opening 140 and controls a via profile of via opening 170—maintaining it chamfer-free during the etching of via opening(s) 170. That is, via etching will not create chamfer 46 (FIG. 4), as previously described herein relative to FIG. 4, in via opening 170. Thus, a via formed therein will be devoid of the chamfer.

Figure 12:
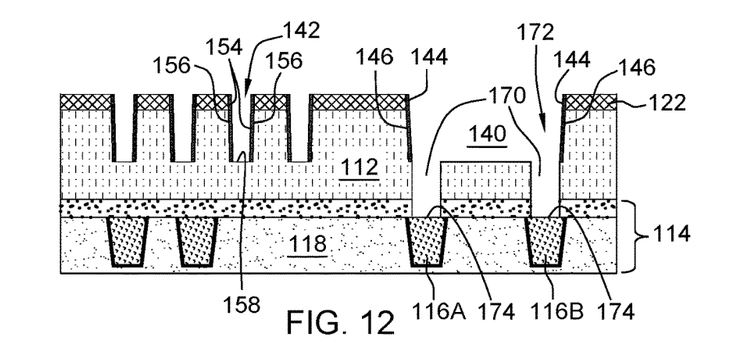

FIG. 12 shows removing etch stop layer 120 over conductive structures 116A, 116B in second ILD layer 118, below via-wire opening 172, to expose an upper surface 174 of conductive structures 116A, 116B. This removing step may include, for example, an isotropic RIE appropriate for etch stop layer 120, e.g., nitrogen-doped carbide (NDC) or nitrogen-doped silicon carbide (SiCxNyHz)(NBLOK). This removing step does not impact, i.e., it leaves, first metal liner sidewall spacer 144 on sidewalls 146 of wire trench opening 140 portion of via-wire opening 172. It is noted that this etching may also remove part of hard mask 122, e.g., titanium nitride (TiN) layer 132 (FIG. 11).

Figure 13:
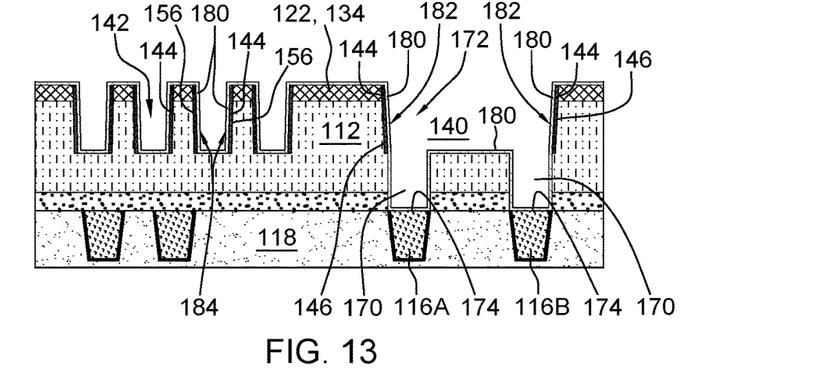

FIG. 13 shows depositing a barrier liner 180 over via-wire opening 172, first metal liner sidewall spacer 144 and exposed upper surface 174 of conductive structures 116A, 116B. Barrier liner 180 may include any now known or later developed barrier liner material (e.g., refractory metal liner) including but not limited to: tantalum nitride (TaN) and tantalum; tantalum nitride, tantalum and cobalt; and magnesium (Mn); or combinations thereof. This depositing creates a first double layered sidewall spacer 182 with first metal liner sidewall spacer 144 on sidewalls 146 of first wire trench opening 140 portion of via-wire opening 172. Via opening 170 portion does not include the double layered sidewall spacer 182. Where second wire trench opening(s) 142 are present, barrier liner 180 may also be deposited over second wire trench opening(s) 142 and second metal liner sidewall spacer 154, creating a second double layered sidewall spacer 184 with second metal liner sidewall spacer 154 on sidewalls 156 of second wire trench opening(s) 142.

Figure 14:
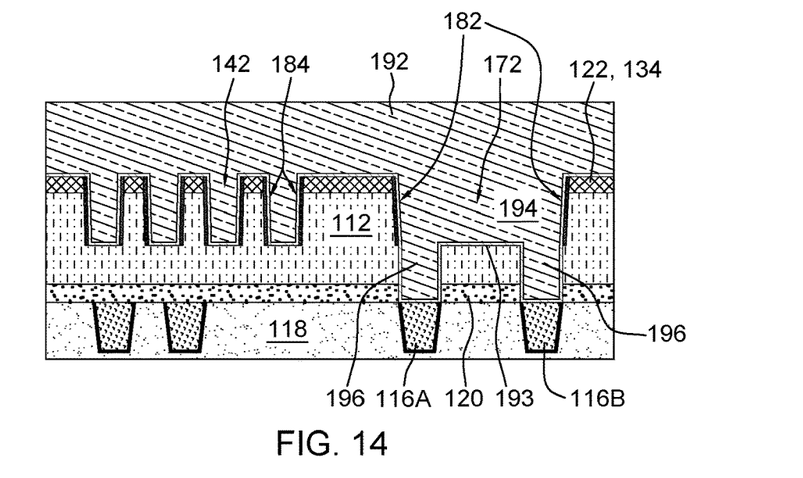
Figure 15:
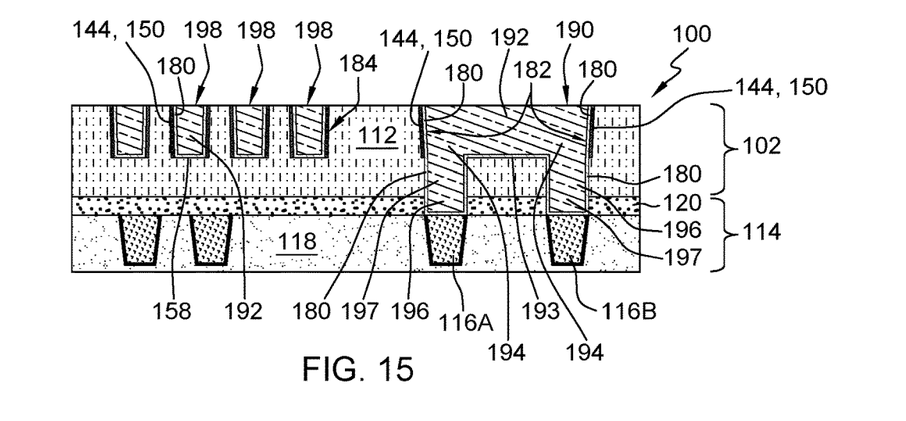

FIGS. 14 and 15 show forming a unitary via-wire conductive structure 190 in via-wire opening 172 by depositing a conductor 192 in via-wire opening 172. Conductor 192 may include any now known or later developed conductive material for an IC such as but not limited to: copper, aluminum, etc. As shown in FIG. 15, first double layered sidewall spacer 182 is positioned between conductor 192 and first ILD layer 112 about a wire trench portion 194 of unitary via-wire conductive structure 190. Wire trench portion 194 is over a via portion 196 of unitary via-wire conductive structure 190. Unitary via-wire conductive structure 190 is so termed because it does not include any other material layers between wire trench portion 194 and via portion 196 thereof, i.e., conductor 192 is one piece, integrally formed. Where second wire trench opening(s) 142 are present, forming unitary via-wire conductive structure 190 may also include forming a conductive structure 198 in second wire trench opening(s) 142 (FIG. 12) by depositing conductor 192 in second wire trench opening(s). FIG. 15 also shows, after depositing conductor 192, planarizing to remove any remaining hard mask 122 (e.g., silicon oxide or silicon oxy-nitride layer 134), any remaining via mask (not shown) and excess conductor 192.

FIG. 15 shows interconnect 100 for an IC according to embodiments of the disclosure. Interconnect 100 may include unitary via-wire conductive structure 190 in ILD layer 112. Unitary via-wire conductive structure 190 includes via portion 196 and wire trench portion 194 above the via portion. There are no intervening material layers between via portion 196 and wire trench portion 194. In the example shown, via portion 194 may include a pair of spaced vias 197 extending from a lower portion of wire trench portion 196 to respective conductive structures 116A, 116B in interconnect layer 114 therebelow. It is recognized that more or less vias 197 can be formed using the process described herein. Here, barrier liner 180 extends between conductor 192 of each of the pair of spaced vias 197 (each side of via portion 196) and ILD layer 112, between conductor 192 of each of the pair of spaced vias 197 and etch stop layer 120, between conductor 192 of each of the pair of spaced vias 197 and a respective conductive structure 116A, 116B in interconnect layer 114 therebelow, and across an upper surface 193 of ILD layer 112 between conductor 192 of the pair of spaced vias 197. Double layered sidewall spacer 182 is positioned between wire trench portion 194 of via-wire conductive structure 190 and ILD layer 112. As noted, double layered sidewall spacer 182 includes metal liner 150 under barrier liner 180. Metal liner 150 (metal liner sidewall spacer 144) extends only between wire trench portion 194 of via-wire conductive structure 190 and ILD layer 112, while barrier liner 180 also extends about via portion 196 of unitary via-wire conductive structure 190. As noted, metal liner 150 (metal liner sidewall spacer 144) may include, for example: ruthenium, cobalt and/or tungsten; and barrier liner 180 may include, for example: tantalum nitride (TaN) and tantalum; tantalum nitride, tantalum and cobalt; and/or magnesium (Mn).

Interconnect 100 may also optionally include a wire conductive structure 198 in the same ILD layer 112 as unitary via-wire conductive structure 190. Wire conductive structure 198 may include wire trench opening 142 (FIG. 13) in ILD layer 112 having sidewalls 156 (FIG. 13) separated by a bottom surface 158 (FIG. 12) and conductor 192 in wire trench opening 142. Wire conductive structure 198 may also include second double layered sidewall spacer 184 on sidewalls 156 thereof between conductor 192 and ILD layer 112. Second double layered sidewall spacer 184 includes a metal liner 150 (metal liner sidewall spacer 144) under barrier liner 180. Here, only barrier liner 180 extends between conductor 192 and ILD 112 at bottom surface 158 of wire trench opening 142 (FIG. 13).

FIGS. 17-21 show a method of forming an interconnect 220 of an IC according to another embodiment of the disclosure. This embodiment starts after FIGS. 6-7, as described previously herein. Summarizing, FIG. 6 shows precursor structure 110 including first interlayer dielectric (ILD) layer 112 (to be part of interconnect layer 222 (FIG. 21)) over interconnect layer 114. Interconnect layer 114 may include a number of conductive structures 116 in second ILD layer 118 under etch stop layer 120. FIG. 6 also shows forming hard mask 122 including wire trench mask pattern 124 therein over precursor structure 110. In the example shown, wire trench mask pattern 124 includes first wire trench mask opening 126 for use in forming one or more a dual damascene via-wire openings according to this embodiment of the disclosure, and may optionally include one or more second wire trench mask openings 128 for conventional wires. FIG. 7 shows etching first wire trench opening 140 partially into first ILD layer 112 using hard mask 122. In accordance with embodiments of the disclosure, first wire trench opening 140 etching, in contrast to conventional dual damascene processes, occurs prior to via opening etching (see FIG. 2). FIG. 7 also shows the first etching including etching second wire trench opening(s) 142 (four shown) partially into first ILD layer 112 using hard mask 122, i.e., second wire trench mask opening(s) 128.

Figure 16:
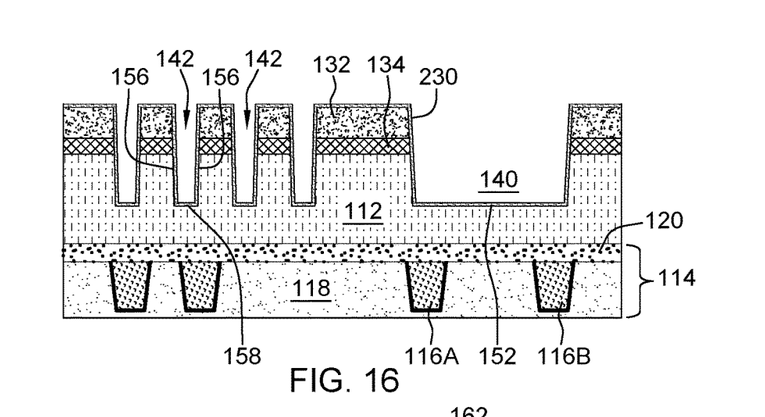
FIGS. 16-21 show cross-sectional views of a method of forming an interconnect according to another embodiment of the disclosure, with FIG. 21 showing an embodiment of the interconnect.

FIG. 16 shows forming a titanium nitride layer 230 in first wire trench opening 140. Titanium nitride layer 230 covers sidewalls 146 and bottom surface 152 of first wire trench opening 140. This process may include, as shown in FIG. 16, depositing titanium nitride layer 230 in first wire trench opening 140. Here, titanium nitride layer 230 may be deposited using, for example, ALD. Where second wire trench opening(s) 142 are provided, titanium nitride layer 230 formation may include forming it within second wire trench opening(s) 142. Here, titanium nitride layer 230 covers sidewalls 156 and bottom surface 158 of second wire trench opening(s) 142. In contrast to the previous embodiment, titanium nitride layer 230 is not removed prior to via etching, as metal liner 150 is in the previous embodiment.

Figure 17:
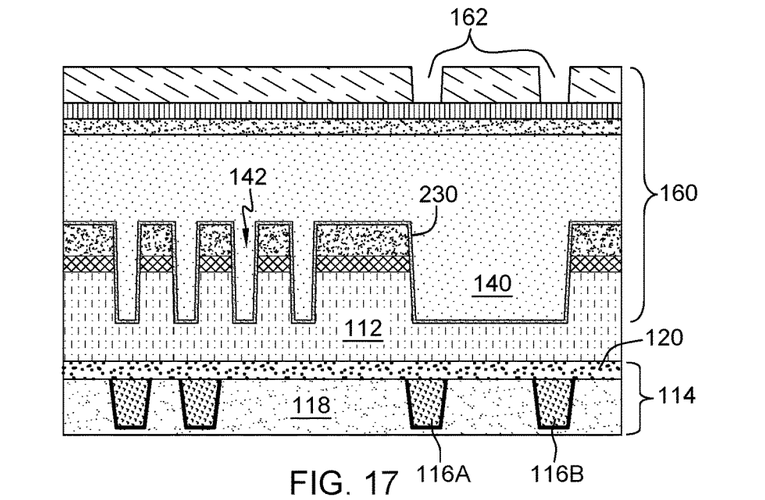

FIG. 17 shows forming via mask 160 over (and in) first wire trench opening 140 and over titanium nitride layer 230. Again, this step occurs after the first etching of wire trench opening 140. Via mask 160 includes via opening mask pattern 162 therein that defines where via openings 170 (FIG. 18) will be formed in ILD 112. Via mask 160 may include any now known or later developed via mask. Via opening mask pattern 162 is positioned over wire trench opening 140, but not over second wire trench opening(s) 142.

Figure 18:
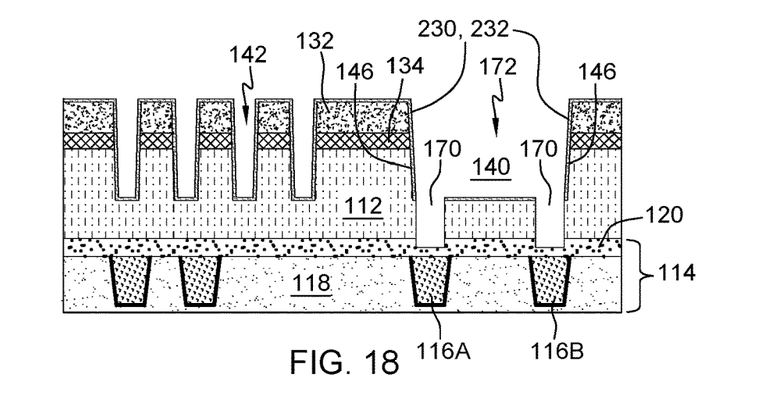

FIG. 18 shows etching via opening(s) 170 through titanium nitride layer 230 and a remaining portion of first ILD layer 112 to etch stop layer 120, some of the latter of which may be etched, using via mask 160. As shown, this etching creates via-wire opening 172 with first wire trench opening 140 in first ILD layer 112. However, titanium nitride layer 230 remains on sidewall 146 of first wire trench opening 140. This etching may include any appropriate etching process for titanium nitride layer 230 and first ILD layer 112. In contrast to conventional processes, titanium nitride layer 230 (as a sidewall spacer 232) maintains a definition of first wire trench opening 140 and via opening 170 chamfer-free during the etching of via opening(s) 170. That is, via etching will not create chamfer 46 (FIG. 4), as previously described herein in via opening 170 (to become a via) or a chamfer in wire trench opening 140 (to become a wire).

Figure 19:
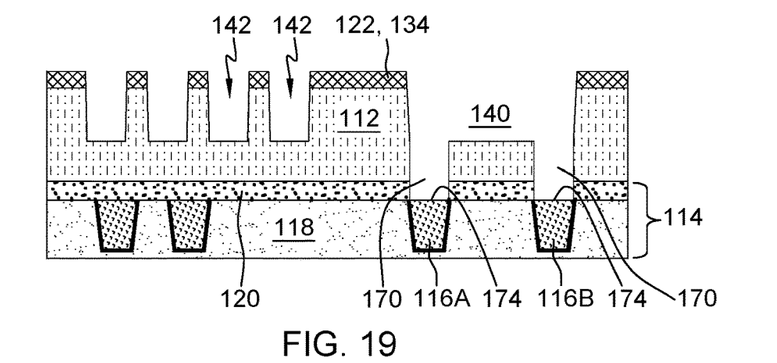

FIG. 19 shows removing titanium nitride layer 230 remaining on sidewall 146 of first wire trench opening 140 and etch stop layer 120 over conductive structures 116A, 116B in via opening 140 to expose upper surface 174 of conductive structures 116A, 116B. This removing step may include, for example, an anisotropic wet etch. This removing step removes titanium nitride layer 230 on sidewalls 146 of wire trench opening 140 portion of via-wire opening 172. It is noted that this etching may also remove part of hard mask 122, e.g., silicon nitride or titanium layer 132 (FIG. 18). Where second wire trench openings 142 are present, this etch also removes titanium nitride layer 230 therefrom.

Figure 20:
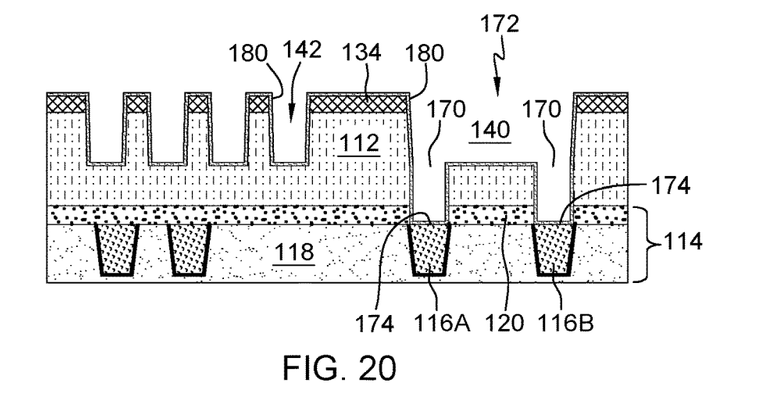

FIG. 20 shows depositing barrier liner 180 over via-wire opening 172 and exposed upper surface 174 of conductive structures 116A, 116B. Barrier liner 180 may include any now known or later developed barrier liner material (e.g., refractory metal liner) including but not limited to: tantalum nitride (TaN) and tantalum; tantalum nitride, tantalum and cobalt; and magnesium (Mn), or combinations thereof. Where second wire trench opening(s) 142 are present, barrier liner 180 may also be deposited within second wire trench opening(s) 142.

Figure 21:
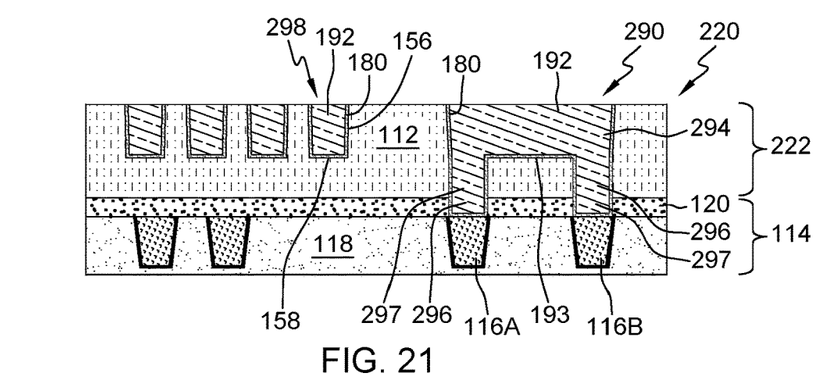

FIG. 21 show forming a unitary via-wire conductive structure 290 in via-wire opening 172 by depositing conductor 192 in via-wire opening 172. Conductor 192 may include any now known or later developed conductive material for an IC such as but not limited to: copper, aluminum, etc. As shown in FIG. 21, barrier liner 180 is positioned between conductor 192 and first ILD layer 112 about a wire trench portion 294 over a via portion 296 of unitary via-wire conductive structure 290. Unitary via-wire conductive structure 290 is so termed because it does not include any other material layers between wire trench portion 294 and via portion 296 thereof, i.e., conductor 192 is one piece, integrally formed. Where second wire trench opening(s) 142 are present, forming unitary via-wire conductive structure 290 may also include forming a conductive structure(s) 298 in second wire trench opening(s) 142 (FIG. 20) by depositing conductor 192 in the second wire trench opening(s). FIG. 21 also shows, after depositing conductor 192, planarizing to remove any remaining hard mask 122 (e.g., silicon oxide or silicon oxy-nitride layer 134), any remaining via mask (not shown) and excess conductor 192.

FIG. 21 shows interconnect 220 for an IC according to embodiments of the disclosure. Interconnect 220 may include unitary via-wire conductive structure 290 in ILD layer 112. Unitary via-wire conductive structure 290 includes via portion 296 and wire trench portion 294 above the via portion. There are no intervening material layers between via portion 296 and wire trench portion 294. Via portion 294 may include a pair of spaced vias 297 extending from a lower portion of wire trench portion 296 to respective conductive structures 116A, 116B in interconnect layer 114 therebelow. Barrier liner 180 extends between conductor 192 of each of pair of spaced vias 297 (each side of via portion 296) and ILD 112, between conductor 192 of each of pair of spaced vias 297 and etch stop layer 120, between conductor 192 of each of the pair of spaced vias 297 and a respective conductive structure 116A, 116B in interconnect layer 114 therebelow, and across an upper surface 193 of ILD layer 112 between conductor 192 of the pair of spaced vias 297. Barrier liner 180 may include, for example: tantalum nitride (TaN) and tantalum; tantalum nitride, tantalum and cobalt; and/or magnesium (Mn).

Interconnect 220 may also optionally include a wire conductive structure 298 in the same ILD layer 112 as unitary via-wire conductive structure 290. Wire conductive structure 298 may include wire trench opening 142 (FIG. 20) in ILD layer 112 having sidewalls 156 separated by bottom surface 158 and conductor 192 in wire trench opening 142. Wire conductive structure 298 may also include barrier layer 180 on sidewalls 156 and bottom surface 158 thereof between conductor 192 and ILD layer 112.

While a single unitary via-wire conductive structures 190, 290 are shown formed by processes herein, it is understood that any number of them may be formed using the masks described herein.

Embodiments of the disclosure provide improved via profile and a chamfer-less via for unitary via-wire conductive structure, i.e., a dual damascene interconnect. The improved via profile can provide improved capacitance and better reliability relative to shorts and TDDB. Further, the improved via profile provides better parametric control, and can eliminate via bumpouts, and via gouging or fanging. The methods may also provide better overlay process control margins, and reduced rework.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method of forming an interconnect of an integrated circuit (IC), the method comprising:
   forming a hard mask including a wire trench mask pattern therein over a precursor structure, the precursor structure including a first interlayer dielectric (ILD) layer over an interconnect layer, the interconnect layer including a number of conductive structures in a second ILD layer under an etch stop layer;
   first etching a first wire trench opening partially into the first ILD layer using the hard mask;
   forming a first metal liner sidewall spacer on sidewalls of the first wire trench opening;
   after the first etching, forming a via mask over the first wire trench opening, the via mask including a via opening mask pattern therein;
   second etching a via opening through a remaining portion of the first ILD layer to the etch stop layer using the via mask, creating a via-wire opening with the first wire trench opening in the first ILD layer;
   removing the etch stop layer over the conductive structures in the second ILD layer to expose an upper surface of the conductive structures, the removing leaving the first metal liner sidewall spacer;
   depositing a barrier liner over the via-wire opening, the first metal liner sidewall spacer and the exposed upper surface of the conductive structures, creating a first double layered sidewall spacer with the first metal liner sidewall spacer on the sidewalls of the first wire trench opening portion of the via-wire opening; and
   forming a unitary via-wire conductive structure in the via-wire opening by depositing a conductor in the via-wire opening.

2. The method of claim 1, further comprising, after depositing the conductor, planarizing to remove any remaining hard mask, any remaining via mask and excess conductor.

3. The method of claim 1, wherein the first double layered sidewall spacer is positioned between the conductor and the first ILD layer about a wire trench portion over a via portion of the unitary via-wire conductive structure.

4. The method of claim 1, wherein the first metal liner sidewall spacer maintains a definition of the first wire trench opening and the via opening chamfer-free during the second etching of the via opening.

5. The method of claim 1, wherein the first metal liner sidewall spacer forming includes depositing a metal liner in the first wire trench opening, and etching the first metal liner from a bottom surface of the first wire trench opening.

6. The method of claim 1, wherein:
   the first etching includes etching a second wire trench opening partially into the first ILD layer using the hard mask;
   the forming the first metal liner sidewall spacer includes forming a second metal liner sidewall spacer on sidewalls of the second wire trench opening;
   the depositing the barrier liner includes depositing the barrier liner over the second wire trench opening and the second metal liner sidewall spacer, creating a second double layered sidewall spacer with the second metal liner sidewall spacer on the sidewalls of the second wire trench opening; and
   the forming the unitary via-wire conductive structure includes forming a conductive structure in the second wire trench opening by depositing the conductor in the second wire trench opening.

7. The method of claim 1, wherein the first metal liner sidewall spacer includes a material selected from the group consisting of: ruthenium, cobalt, and tungsten; and the barrier liner includes a material selected from the group consisting of: tantalum nitride (TaN) and tantalum; tantalum nitride, tantalum and cobalt; and magnesium (Mn).

8. A method of forming an interconnect of an integrated circuit (IC), the method comprising:
   forming a hard mask including a wire trench mask pattern therein over a precursor structure, the precursor structure including a first interlayer dielectric (ILD) layer over an interconnect layer, the interconnect layer including a number of conductive structures in a second ILD layer under an etch stop layer;
   first etching a first wire trench opening partially into the first ILD layer using the hard mask;
   forming a titanium nitride layer in the first wire trench opening;
   after the first etching, forming a via mask over the first wire trench opening in the first ILD layer, the via mask including a via opening mask pattern therein;
   second etching a via opening through the titanium nitride layer and a remaining portion of the first ILD layer to the etch stop layer using the via mask, creating a via-wire opening with the first wire trench opening, the titanium nitride layer remaining on a sidewall of the first wire trench opening;
   removing the titanium nitride layer remaining in the sidewall of the first wire trench opening and the etch stop layer over the conductive structures in the via opening in the second ILD layer to expose an upper surface of the conductive structures;
   depositing a barrier liner over the via-wire opening, and the exposed upper surface of the conductive structures; and
   forming a unitary via-wire conductive structure in the via-wire opening by depositing a conductor in the via-wire opening.

9. The method of claim 8, further comprising, after depositing the conductor, planarizing to remove any remaining hard mask, any remaining via mask and excess conductor.

10. The method of claim 8, wherein the titanium nitride layer maintains a definition of the first wire trench opening and the via opening chamfer-free during the second etching of the via opening.

11. The method of claim 8, wherein the barrier liner includes a material selected from the group consisting of: tantalum nitride (TaN) and tantalum; tantalum nitride, tantalum and cobalt; and magnesium (Mn).

12. The method of claim 8, wherein:
- the first etching includes etching a second wire trench opening partially into the first ILD layer using the hard mask;
- the forming the titanium nitride layer includes forming the titanium nitride layer in the second wire trench opening;
- the removing the titanium nitride layer includes removing the titanium nitride layer from the second wire trench opening;
- the depositing the barrier liner includes depositing the barrier liner over the second wire trench opening; and
- the forming the conductive structure includes forming a wire conductive structure in the second wire trench opening by depositing the conductor in the second wire trench opening.

\* \* \* \* \*